United States Patent
Park et al.

(10) Patent No.: US 11,208,723 B2
(45) Date of Patent: Dec. 28, 2021

(54) ORGANOMETALLIC PRECURSOR COMPOUND FOR VAPOR DEPOSITION FOR FORMING OXIDE THIN FILM AND METHOD FOR MANUFACTURING SAME

(71) Applicant: HANSOL CHEMICAL CO., LTD., Seoul (KR)

(72) Inventors: Jung Woo Park, Seoul (KR); Donghak Jang, Jeonju-si (KR); Yeong Eun Kim, Changwon-si (KR); Hyo-Suk Kim, Jeonju-si (KR); Kwang Soo Lim, Jeonju-si (KR)

(73) Assignee: HANSOL CHEMICAL CO., LTD., Seoul (KR)

( * ) Notice: Subject to any disclaimer, the term of this patent is extended or adjusted under 35 U.S.C. 154(b) by 444 days.

(21) Appl. No.: 16/336,520

(22) PCT Filed: Sep. 30, 2016

(86) PCT No.: PCT/KR2016/010941
§ 371 (c)(1),
(2) Date: Mar. 26, 2019

(87) PCT Pub. No.: WO2018/062590
PCT Pub. Date: Apr. 5, 2018

(65) Prior Publication Data
US 2021/0285103 A1    Sep. 16, 2021

(51) Int. Cl.
| C23C 16/455 | (2006.01) |
| C01G 49/00 | (2006.01) |
| C23C 16/40 | (2006.01) |
| C07F 15/02 | (2006.01) |

(52) U.S. Cl.
CPC .... *C23C 16/45553* (2013.01); *C01G 49/0018* (2013.01); *C07F 15/025* (2013.01); *C23C 16/409* (2013.01); *C23C 16/45527* (2013.01); *C01P 2002/34* (2013.01)

(58) Field of Classification Search
None
See application file for complete search history.

(56) References Cited

U.S. PATENT DOCUMENTS

| 9,428,835 B2 | 8/2016 | Machida et al. |
| 2009/0087561 A1 | 4/2009 | Chen et al. |
| 2018/0346501 A1* | 12/2018 | Adermann ............. C09D 5/021 |

FOREIGN PATENT DOCUMENTS

| KR | 2008-0031935 A | 4/2008 |
| KR | 2010-0082248 A | 7/2010 |
| KR | 2014-0029428 A | 3/2014 |
| KR | 2016-0096480 A | 8/2016 |

OTHER PUBLICATIONS

Lim, et al., "Atomic layer deposition of lanthanum aluminum oxide nano-laminates for electrical applications" Appl. Phys. Lett., vol. 84, No. 20, pp. 3957-3959, (2004).

Inman, et al., "Atomic layer deposition of lanthana thin films using high-purity lanthanum amino precursors", Mat. Chem. Phys., vol. 104, Issues 2-3, pp. 220-224, Aug. 15, 20107.

Eleter, et al., "Syntheses and structures of novel hafnium chloroamido mono-amidinate and mono-guanidinate as precursors for HfO2 thin film", Polyhedron, vol. 29, No. 12, pp. 2522-2526, 2010.

* cited by examiner

*Primary Examiner* — Clinton A Brooks
(74) *Attorney, Agent, or Firm* — BakerHostetler

(57) ABSTRACT

An organometallic compound, which enables thin-film deposition through vapor deposition, and particularly to a Co or Fe precursor, which is suitable for use in atomic layer deposition or chemical vapor deposition, and a method of preparing the same.

9 Claims, No Drawings

ORGANOMETALLIC PRECURSOR COMPOUND FOR VAPOR DEPOSITION FOR FORMING OXIDE THIN FILM AND METHOD FOR MANUFACTURING SAME

CROSS-REFERENCE TO RELATED APPLICATIONS

This application is a National Stage of International patent application PCT/KR2016/010941, filed on Sep. 30, 2016, the disclosure of which is incorporated by reference in its entirety.

FIELD OF THE INVENTION

The present invention relates to an organometallic compound, which enables thin-film deposition through vapor deposition, and particularly to a Co or Fe precursor, which may be applied to atomic layer deposition (ALD) or chemical vapor deposition (CVD), and a method of preparing the same.

BACKGROUND

High-performance nano-scale perovskite materials have good potential for use as advanced nanomaterials, and most examples thereof are obtained using a solid-phase process or a liquid-phase process. However, the use of a solid-phase process or a liquid-phase process makes it difficult to precisely control the properties and structures of materials because the materials are synthesized in bulk form, and thus limitations are imposed in ensuring and controlling the properties necessary for a variety of application fields. In particular, since it is difficult to ensure material reproducibility depending on the external environment during material synthesis and also to ensure material uniformity in controlling the powder size during a physical grinding process, the synthesis process needs to be improved.

When using an atomic layer deposition (ALD) process capable of depositing a thin film having an atomic-level composition and a chemical vapor deposition (CVD) process in which a source gas and a final thin film have chemical compositions different from each other, the above limitations of the solid-phase process or the liquid-phase process may be overcome, but achievements of organometallic precursors containing La, Co, Mn or Fe as the central metal and having a melting point, a boiling point, volatility, viscosity and thermal stability suitable for vapor deposition are currently insufficient. Specifically, an alkoxide-based ligand, which is typically used, has an extremely low rate of growth of a thin film thereof owing to low reactivity with an oxidizing reaction gas ($H_2O$, $O_2$, $O_3$, etc.), and an amido-based ligand may undergo pyrolysis at high temperatures of 200° C. or more due to the reactivity of the central metal with the alkyl group. A β-diketonate-based ligand is low in volatility, a diamino-based ligand is disadvantageous in that the ligand dissociation rate is lowered due to interaction with the reaction gas because of the chelating structure thereof, and an amino-alcohol-based ligand also has low volatility and an elevated melting point. Alkyl- and aryl-based ligands are also thermally unstable. When an amidinate or amide ligand is introduced, the volatility of an organometallic precursor is insufficient, and when a cyclopentadienyl ligand is introduced, the impurity content in a thin film obtained by depositing an organometallic precursor is increased.

Accordingly, there is required the development of a novel high-performance perovskite-type organometallic precursor, which may be utilized in a variety of industrial fields, such as those of fuel cells, sensors and secondary batteries, by designing and introducing a new type of ligand.

Meanwhile, an example of the use of a Co precursor for thin-film deposition is U.S. Pat. No. 9,428,835, and thorough research into precursors for vapor deposition using La, Co, Mn or Fe as the central metal has been carried out domestically and abroad, but demonstrable research achievements of the development and application of $ABX_3$-type materials to date are insignificant, and thus there is still a need to develop a novel perovskite-type organometallic precursor [Korea Research Institute of Chemical Technology, Purpose-oriented molecular precursor design and synthesis suitable for CVD/ALD, Ministry of Future Creation and Science (2010); B. S. Lim, A. Rahtu, P. D. Rouffignac and R. G. Gordon, Appl. Phys. Lett., 84, 3957 (2004); R, Inman, S. A. Schuetz, C. M. Silvernail, S. Balaz, P. A. Dowben, G. Jursich, J. McAndrew, J. A. Belot, Mat. Chem. Phys., 104, 220 (2007)].

SUMMARY OF THE INVENTION

Therefore, the present invention is intended to provide a novel organometallic compound, which may be applied to atomic layer deposition (ALD) or chemical vapor deposition (CVD). In particular, the present invention is intended to provide a nano-scale organometallic compound for vapor deposition, which enables precise control of components and a composition thereof, thus making it possible to adjust the properties of a material, an organometallic precursor including the same, and a method of preparing the same.

However, the problems to be solved by the present invention are not limited to the foregoing, and other problems not mentioned herein may be clearly understood by those skilled in the art through the following description.

An aspect of the present invention provides an organometallic compound represented by Chemical Formula 1 below:

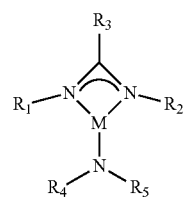

[Chemical Formula 1]

in Chemical Formula 1,

M is Co or Fe, $R_1$, $R_2$, $R_4$ and $R_5$ are each independently a substituted or unsubstituted C1-C4 linear or branched, saturated or unsaturated alkyl group, an isomer thereof or $Si(R_6R_7R_8)$, preferably, $R_4$ and $R_5$ are each independently $^tBu$ or $SiMe_3$, $R_6$ to $R_8$ are each independently a substituted or unsubstituted C1-C4 linear or branched, saturated or unsaturated alkyl group or an isomer thereof, and $R_3$ is hydrogen, a substituted or unsubstituted C1-C4 linear or branched, saturated or unsaturated alkyl group or an isomer thereof.

Another aspect of the present invention provides an organometallic precursor for vapor deposition comprising the organometallic compound of Chemical Formula 1.

Still another aspect of the present invention provides a method of manufacturing a thin film by depositing an organometallic precursor for vapor deposition, the method comprising: subjecting the organometallic precursor for vapor deposition to physical/chemical adsorption on a substrate, purging the organometallic precursor for vapor deposition, which is not adsorbed, with an inert gas, and introducing a reaction gas.

According to the present invention, an organometallic compound and a precursor including the same can exhibit excellent volatility and low impurity content in a thin film upon thin-film deposition using a vapor deposition process. Furthermore, the precursor of the invention is a liquid precursor at room temperature, thus ensuring processing convenience, high and uniform volatility, and a uniform deposition rate and enabling the deposition of a thin film having superior step coverage. Also, thermal stability can be attained in the processing temperature range, ultimately improving the quality of a thin film.

Thereby, various organometallic compounds suitable for use in a vapor deposition process can be provided, and additionally, organometallic precursors useful in a variety of fields including next-generation semiconductor fields using technology for synthesizing and controlling ligands and precursors are expected to be provided.

Moreover, a perovskite material can be synthesized in the form of a thin film having superior properties and a size on the scale of ones of nanometers, thus making it possible to provide basic and fundamental technologies that are academically meaningful and can also be widely utilized in future industries.

DETAILED DESCRIPTION

Hereinafter, embodiments and examples of the present invention will be described in detail so that those skilled in the art can easily carry out the present invention with reference to the accompanying drawings. However, the present invention may be embodied in many different forms, and is not limited to the embodiments and examples described herein. In order to clearly illustrate the present invention in the drawings, parts not related to the description are omitted.

As used herein, it is to be understood that the formation of any member "on" another member includes not only the case where the member is in contact with the other member but also the case where a further member is present between the two members.

As used herein, when any part "includes" any element, it is to be understood that it may further include other elements as well, rather than excluding such other elements, unless otherwise stated.

As used herein, the "step that" or "step of ~" does not mean the "step for ~".

As used herein, Me represents a methyl group, Et represents an ethyl group, $^i$Pr represents an iso-propyl group, $^t$Bu represents a tert-butyl group, and SiMe$_3$ represents Si(CH$_3$)$_3$.

An aspect of the present invention pertains to an organometallic compound represented by Chemical Formula 1 below:

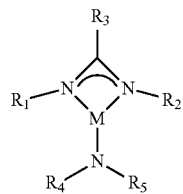

[Chemical Formula 1]

in Chemical Formula 1,

M is Co or Fe, $R_1$, $R_2$, $R_4$ and $R_5$ are each independently a substituted or unsubstituted C1-C4 linear or branched, saturated or unsaturated alkyl group, an isomer thereof or Si($R_6R_7R_8$), preferably, $R_4$ and $R_5$ are each independently $^t$Bu or SiMe$_3$, $R_6$ to $R_8$ are each independently a substituted or unsubstituted C1-C4 linear or branched, saturated or unsaturated alkyl group or an isomer thereof, and $R_3$ is hydrogen, a substituted or unsubstituted C1-C4 linear or branched, saturated or unsaturated alkyl group or an isomer thereof.

Another aspect of the present invention pertains to an organometallic precursor for vapor deposition comprising the organometallic compound of Chemical Formula 1.

According to an embodiment of the present invention, in Chemical Formula 1, $R_1$ and $R_2$ may be $^i$Pr, $R_3$ may be Me or Et, and $R_4$ and $R_5$ may each independently be $^t$Bu or SiMe$_3$. Here, Me represents a methyl group, Et represents an ethyl group, $^i$Pr represents an iso-propyl group, $^t$Bu represents a tert-butyl group, and SiMe$_3$ represents Si(CH$_3$)$_3$.

According to an embodiment of the present invention, in Chemical Formula 1, $R_1$ may be $^t$Bu, $R_2$ may be Et, $R_3$ may be Me or Et, and $R_4$ and $R_5$ may each independently be $^t$Bu or SiMe$_3$. Here, Me represents a methyl group, Et represents an ethyl group, $^i$Pr represents an iso-propyl group, $^t$Bu represents a tert-butyl group, and SiMe$_3$ represents Si(CH$_3$)$_3$.

Still another aspect of the present invention pertains to an organometallic precursor for vapor deposition comprising an organometallic compound prepared based on the present invention.

In an embodiment of the present invention, the vapor deposition may include, but is not limited to, atomic layer deposition (ALD) or chemical vapor deposition (CVD).

Yet another aspect of the present invention pertains to a method of manufacturing a thin film by depositing an organometallic precursor for vapor deposition, the method comprising subjecting an organometallic precursor for vapor deposition of Chemical Formula 1 to physical/chemical adsorption on a substrate, purging the organometallic precursor for vapor deposition, which is not adsorbed, with an inert gas, and introducing a reaction gas.

In an embodiment of the present invention, the reaction gas may include, but is not limited to, at least one selected from among hydrogen peroxide (H$_2$O$_2$), water vapor (H$_2$O), oxygen (O$_2$), and ozone (O$_3$).

In an embodiment of the present invention, the thin film may be a metal oxide thin film, particularly a perovskite thin film. The perovskite thin film may include, but is not limited to, a perovskite nanocrystal structure ABX$_3$.

A better understanding of the present invention will be given through the following Example and Preparation Example, which are not to be construed as limiting the present invention.

Example

Preparation of Organometallic Precursor

Bis[bis(trimethylsilyl)amido]iron(II) (Fe(btmsa)$_2$) (0.0320 mol, 12.05 g) and dry toluene (50 mL) were placed in a 250 mL flask and stirred, thus affording a dark brown solution. N'-tert-butyl-N-ethyl propionimidamide (Et-$^t$Bu-Et-amidine) (0.0320 mol, 5.00 g) and dry toluene (50 mL) were placed in a 100 mL flask and cooled to 0° C. with stirring. The previously prepared Fe(btmsa)$_2$ solution was slowly added to the stirred solution. When the above solution was added, white smoke was generated during the reaction and a dark brown solution resulted, which was then stirred at room temperature for 16 hr. After termination of the reaction, the solvent was removed in a vacuum, and the remaining volatile material was extracted with hexane, thus yielding [Et-$^t$Bu-Et-AMD]Fe(btmsa). The organometallic precursor Et-$^t$Bu-Et-AMD]Fe(btmsa) is a compound of Chemical Formula 1 according to the present invention, in which R$_1$=$^t$Bu, R$_2$=Et, R$_3$=Et, R$_4$=SiMe$_3$, R$_5$=SiMe$_3$ and M=Fe(II).

Preparation Example

Formation of Metal Oxide Thin Film

The organometallic precursor [Et-$^t$Bu-Et-AMD]Fe (btmsa) including the organometallic compound of Chemical Formula 1 prepared in the above Example was deposited in a thin film using an ALD device. The substrate used therefor was a p-type Si(100) wafer having a resistance of 0.02·cm. Before the deposition, the p-type Si wafer was washed through ultrasonic treatment with each of acetone, ethanol, and deionized (DI) water for 10 min each. The oxide thin film naturally formed on the Si wafer was immersed in a solution of 10% HF (HF:H$_2$O=1:9) for 10 sec and then taken out therefrom. The Si wafer washed with HF was immediately transferred into an ALD chamber. The organometallic precursor used therefor was a Fe-containing precursor, but a Co-containing precursor may be used. The reaction temperature was maintained at 85° C. The organometallic precursor of Chemical Formula 1 (15 sec), Ar (30 sec), O3 (5 sec/8 sec/10 sec) and Ar (30 sec) were sequentially supplied, and the flow rate of argon (Ar) for purging was 100 sccm. Used as the reaction gas, ozone (O3) was allowed to flow at a rate of 30 sccm. Each reaction gas was introduced by adjusting the on/off operation of a pneumatic valve, and the pressure of the reactor was set to 1 torr at a deposition temperature ranging from 260° C. to 340° C.

The organometallic precursor for vapor deposition was prepared as in the above Example, and the oxide thin film was formed by depositing the organometallic precursor for vapor deposition as in the above Preparation Example. The oxide thin film thus obtained is a metal oxide thin film, particularly a perovskite thin film.

A thin film resulting from depositing a perovskite material having an ABX$_3$ structure has superior physical properties, such as those pertaining to ferroelectric and superconducting phenomena. In the perovskite material, A and B may be cations having different sizes, and X may be oxygen (O$_2$). The ratio of A, B and X elements is finely adjusted, thus enabling the formation of a perovskite thin film having a size on the scale of ones of nanometers.

The organometallic precursor [Et-$^t$Bu-Et-AMD]Fe (btmsa) prepared in Example of the prevent invention and the metal oxide thin film formed in Preparation Example through ALD using the same have the following advantages. Specifically, the organometallic precursor [Et-$^t$Bu-Et-AMD] Fe(btmsa) is a liquid at room temperature, thus ensuring processing convenience and uniform volatility and assuring an improvement in film quality by virtue of thermal stability in the processing range. Furthermore, a high deposition rate may be realized due to high reactivity with the reaction gas (H$_2$O$_2$, H$_2$O, O$_2$ or O$_3$) during the processing.

The scope of the invention is represented by the claims below rather than the aforementioned detailed description, and all changes or modified forms that are capable of being derived from the meaning, range, and equivalent concepts of the appended claims should be construed as being included in the scope of the present invention.

The invention claimed is:

1. An organometallic compound represented by Chemical Formula 1 below:

[Chemical Formula 1]

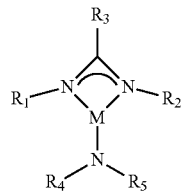

in Chemical Formula 1,

M is Co or Fe,

R$_1$, R$_2$, R$_4$ and R$_5$ are each independently a substituted or unsubstituted C1-C4 linear or branched, saturated or unsaturated alkyl group, an isomer thereof or Si(R$_6$R$_7$R$_8$), R$_6$ to R$_8$ are each independently a substituted or unsubstituted C1-C4 linear or branched, saturated or unsaturated alkyl group or an isomer thereof, and R$_3$ is hydrogen, a substituted or unsubstituted C1-C4 linear or branched, saturated or unsaturated alkyl group or an isomer thereof.

2. The organometallic compound of claim 1, wherein, in Chemical Formula 1,

R$_1$ and R$_2$ are $^i$Pr,

R$_3$ is Me or Et, and

R$_4$ and R$_5$ are each independently $^t$Bu or SiMe$_3$, wherein Me represents a methyl group, Et represents an ethyl group, $^i$Pr represents an iso-propyl group, $^t$Bu represents a tert-butyl group, and SiMe$_3$ represents Si(CH$_3$)$_3$.

3. The organometallic compound of claim 1, wherein, in Chemical Formula 1,

R$_1$ is $^t$Bu,

R$_2$ is Et,

R$_3$ is Me or Et, and

R$_4$ and R$_5$ are each independently $^t$Bu or SiMe$_3$, wherein Me represents a methyl group, Et represents an ethyl group, $^i$Pr represents an iso-propyl group, $^t$Bu represents a tert-butyl group, and SiMe$_3$ represents Si(CH$_3$)$_3$.

4. An organometallic precursor for vapor deposition, comprising the organometallic compound of claim 1.

5. The organometallic precursor of claim 4, wherein the vapor deposition includes atomic layer deposition or chemical vapor deposition.

6. A method of manufacturing a thin film, comprising:
subjecting the organometallic precursor of claim 4 to physical/chemical adsorption on a substrate,
purging the organometallic precursor, which is not adsorbed, with an inert gas, and
introducing a reaction gas.

7. The method of claim 6, wherein the reaction gas includes at least one selected from among hydrogen peroxide ($H_2O_2$), water vapor ($H_2O$), oxygen ($O_2$), and ozone ($O_3$).

8. The method of claim 6, wherein the thin film is a metal oxide thin film.

9. The method of claim 8, wherein the metal oxide thin film is a perovskite thin film.

* * * * *